United States Patent
Konno

(10) Patent No.: US 6,899,567 B2
(45) Date of Patent: May 31, 2005

(54) MEMORY SOCKET

(75) Inventor: Yuuji Konno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 28 days.

(21) Appl. No.: 10/625,336

(22) Filed: Jul. 22, 2003

(65) Prior Publication Data

US 2004/0240295 A1 Dec. 2, 2004

(30) Foreign Application Priority Data

Aug. 26, 2002 (JP) ...................................... 2002-245513

(51) Int. Cl.$^7$ ............................................ H01R 24/00
(52) U.S. Cl. ........................................................ 439/637
(58) Field of Search .................... 439/637, 60, 188, 439/79, 82–83

(56) References Cited

U.S. PATENT DOCUMENTS

| | | | | |
|---|---|---|---|---|
| 3,912,353 A | * | 10/1975 | Kasuya et al. | 439/329 |
| 4,288,139 A | * | 9/1981 | Cobaugh et al. | 439/267 |
| 6,498,731 B1 | * | 12/2002 | Roscoe et al. | 361/796 |
| 6,634,889 B2 | * | 10/2003 | Miller et al. | 439/60 |

FOREIGN PATENT DOCUMENTS

JP          64-84397          3/1989

* cited by examiner

Primary Examiner—J. F. Duverne
(74) Attorney, Agent, or Firm—Katten Muchin Zavis Rosenman

(57) ABSTRACT

A memory socket, particularly a detachable memory card (DIMM), in which equal-length wiring can be obtained in a wiring design, is provided. A memory socket for mounting a detachable memory card on a circuit board is comprised of a first memory socket in which a first memory card is inserted, with a surface facing upward and a second memory socket in which a second memory card is inserted, with the other surface facing upward. The first memory socket and the second memory socket are arranged adjacent each other on said circuit board. The first and second memory cards are inserted from the outside of the first and second memory sockets, in opposite directions.

3 Claims, 8 Drawing Sheets

MEMORY SOCKET

BACKGROUND OF THE INVENTION

1. Field of the Invention

This invention relates to a memory socket, and particularly, it relates to a memory socket which is used to mount a memory card, as a detachable component, on a printed board, and the length of wiring.

2. Description of the Related Art

Recently, the minatureization and enhancement of the performance of a computer or a network device, etc., have been rapidly achieved. To this end, large-scale integration of components, an increase in processing speed, and a high-density mounting technology for mounting the components on the printed circuit board have been required at each stage of development of products.

FIG. 1 shows an example of a router device, and FIG. 2 shows an example of an arrangement of components on a daughter board shown in FIG. 1.

As shown in FIG. 1, the router device 10 is comprised of a power supply unit 11, a back panel 12 which supplies electricity to a plurality of circuit boards mounted thereon from the power supply unit 11 and connects signal lines among the printed circuit boards, a motherboard 13 and a daughter board 14, which is an extension board for the motherboard 14, mounted on the back panel 12.

The daughter board 14, shown in FIG. 2, is provided with connectors 15 and 16 for connecting power supply lines and the signal lines, etc. to those of the motherboard 13 opposed to the daughter board 14. A CPU chip 17 provides a high-speed clock signal of 100 MHz to memory cards (DIMM) 18 and 19 comprised of synchronous type DRAMs, such as SDRAMs (Synchronous DRAMs), to carry out clocked synchronization of the memory cards in order to operate them logically as a single memory.

Each of the memory cards 18 and 19 is horizontally mounted on the daughter board 14 because of the distance (see FIG. 1) between the motherboard 13 and the daughter board 14. In the example, the CPU chip 17 of a clock signal source is located closer to the memory card 18 than the memory card 19. Therefore, a bypass line is provided to a line connecting between the memory card 18 and the CPU chip 17, so that no time difference (skew) occurs between the two memory cards 18 and 19.

Due to the bypass route, the wiring length between the memory card 18 and the CPU chip 17 is identical to that between the memory card 19 and the CPU chip 17 (this arrangement rule is referred to as "equal-length wiring"). In the example, the clock period of 100 MHz clock signal is 10 ns and the clock width thereof is one-half of the clock period, i.e., 5 ns.

The loss of a design margin of a few ns is caused due to various conditions including skew, the wiring capacity, irregularity of the components, the ambient temperature, the temperature of the chip during operation, etc., which result in a lack of a guarantee of correct operation. To prevent this, the designing of the wiring is conducted in such a way that the wiring length is made as short as possible and that equal-length wiring is established.

FIG. 3 shows an example, similar to an example shown in FIG. 2, in which conventional memory sockets are arranged in parallel and are oriented in the same direction.

The equal-length wiring can be easily obtained because, in this example, the clock pins of the memory cards 18 and 19 can be placed at an equal distance from the clock source 17.

However, it is necessary to provided a space for inserting and removing operations of the memory cards therebetween. Therefore, a group of memory slots unnecessarily occupies an area of the board. This makes it difficult to reduce the size and cost of the device.

FIG. 4 shows an example in which conventional memory sockets are arranged in parallel and are oriented in opposite directions.

In this example, in order to reduce an area of a group of the memory sockets shown in FIG. 3, a memory socket of the memory card 19 is turned in a horizontal plane by 180 degrees to face in a direction opposite to that shown in FIG. 3 and is attached to the board. Thus, the space between the memory cards 18 and 19 for inserting and removing operations of the memory card can be made smaller.

However, the opposed pins are arranged in opposite orders and a bypass route necessary to realize the equal-length wiring must be provided on one of the memory sockets. Consequently, wiring design is made difficult and the area of the bypass route is increased. As mentioned above, the examples shown in FIG. 3 and FIG. 4 have advantages but also have problems to be solved.

SUMMARY OF THE INVENTION

In order to solve the problems, the object of the invention is to provide a memory socket in which equal-length wiring can be obtained, without providing a bypass route, and a wiring design to reduce the wiring length can be achieved. As a result, not only higher density mounting can be carried out but also higher speed clock operation can be achieved. Thus, the memory socket contributes to a reduction in the size, and an increase in the performance, of the device.

According to the invention, there is provided a memory socket for mounting a detachable memory card on a circuit board, comprising a first memory socket in which a first memory card is inserted, with a surface facing upward, a second memory socket in which a second memory card is inserted, with the other surface facing upward, said first memory socket and said second memory socket being arranged adjacent each other on said circuit board, said first and second memory cards being inserted from the outside of said first and second memory sockets, in opposite directions.

The first memory socket and the second memory socket can have opposed pins which are arranged identically and the first memory socket and the second memory socket can be integrated to form a single memory socket. Pairs of opposed pins of the first and second memory sockets which forms a single memory socket can be each replaced with a single common pin.

According to the invention there is also provided a memory socket for mounting a detachable memory card on a circuit board, comprising a first insertion opening in which a first memory card is inserted with a surface facing upward, a second insertion opening in which a second memory card is inserted with the other surface facing upward, the first opening and the second opening being oriented in opposite directions, the first opening and the second opening have pins arranged identically.

BRIEF DESCRIPTION OF THE DRAWINGS

The present invention will be more clearly understood from the description as set forth below with reference to the accompanying drawings.

DESCRIPTION OF THE PREFERRED EMBODIMENTS

Figure 5:
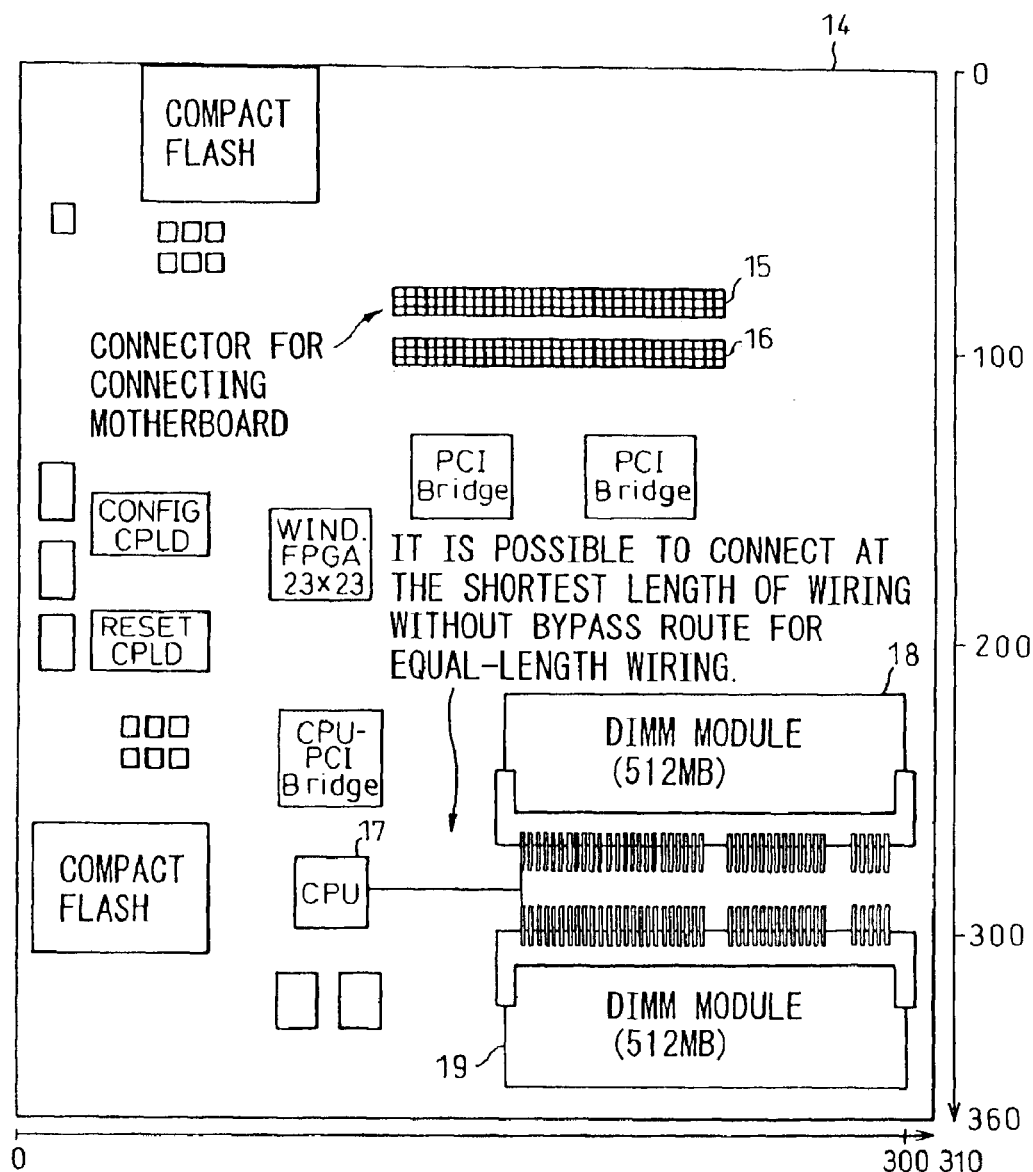
FIG. 5 shows an embodiment of an arrangement of components in the invention.

FIG. 5 shows an embodiment of an arrangement of components on a daughter board according to the invention.

Figure 1:
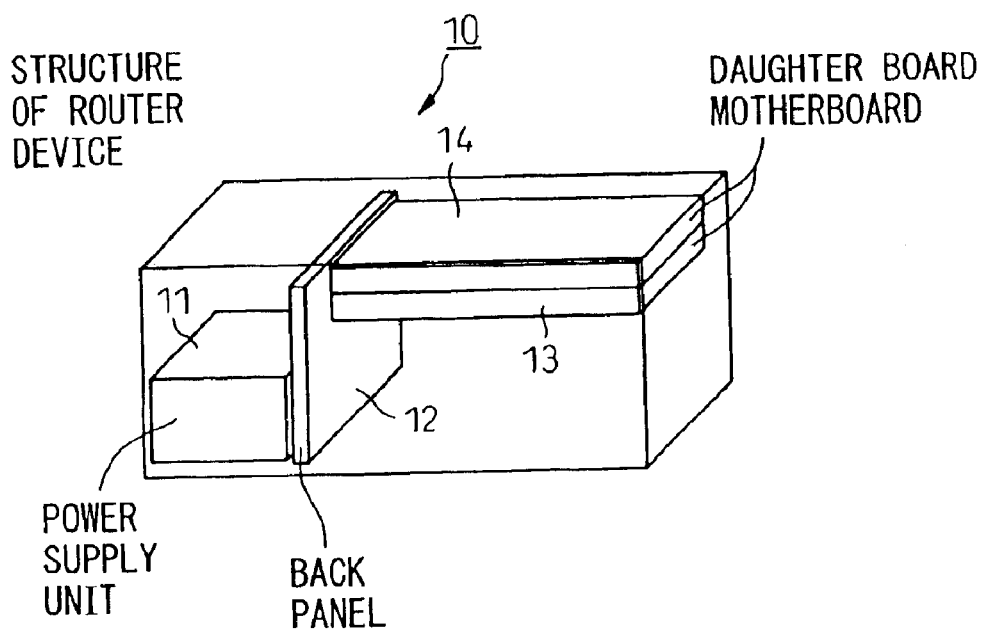
FIG. 1 shows an example of a configuration of a router device.
Figure 2:
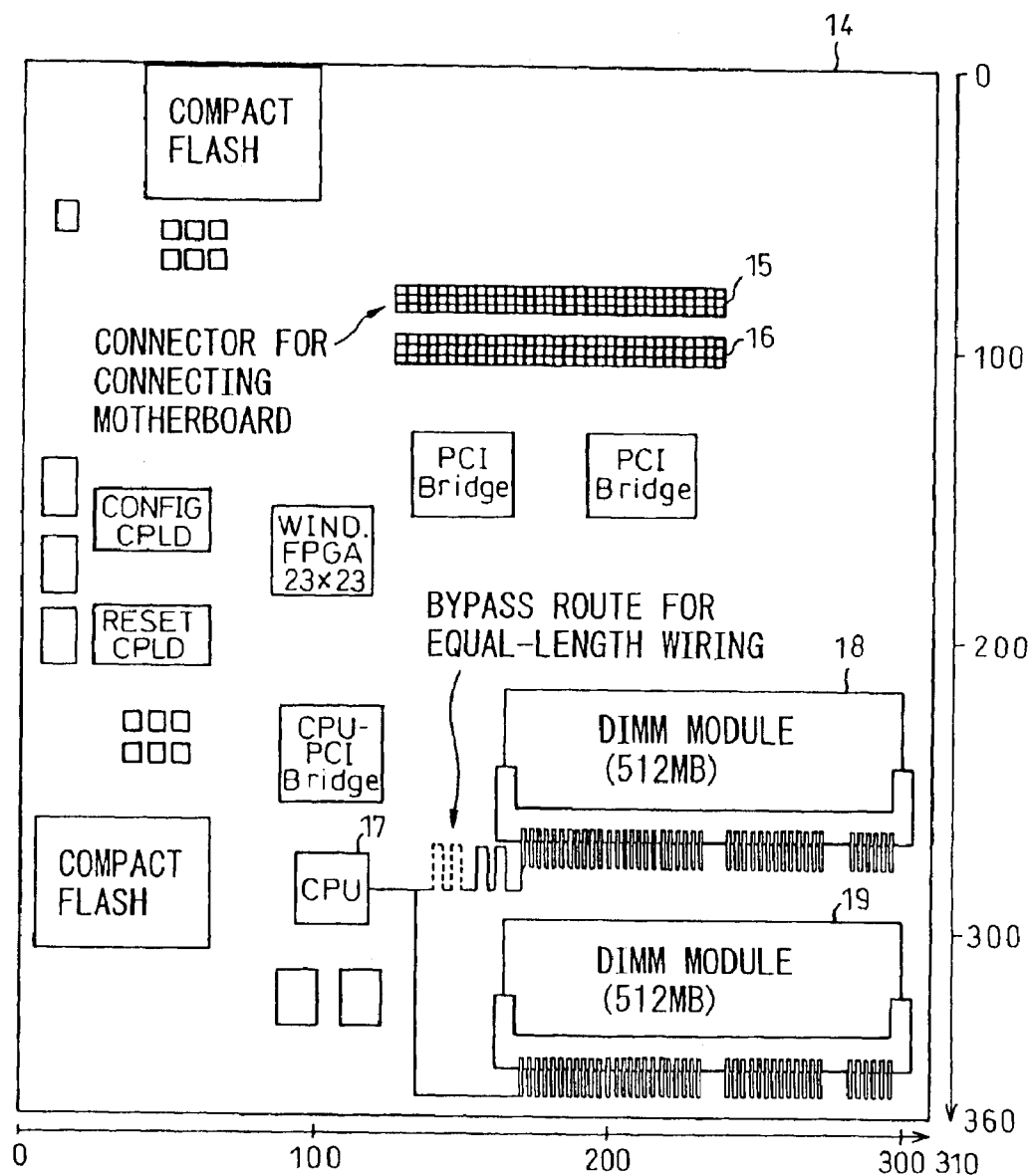
FIG. 2 shows an example of a conventional arrangement of components.

In FIG. 5, memory cards 18 and 19 are inserted in respective memory sockets, which are arranged close to each other, in opposite directions. One of the memory cards is inserted into the corresponding memory socket, with a front or rear surface facing upward and the other memory card is inserted in to the other memory socket, with a rear or front surface facing upward. Other components 15–17 are identical those shown in FIG. 2 and no duplicate description therefor will be given herein.

Figure 6:
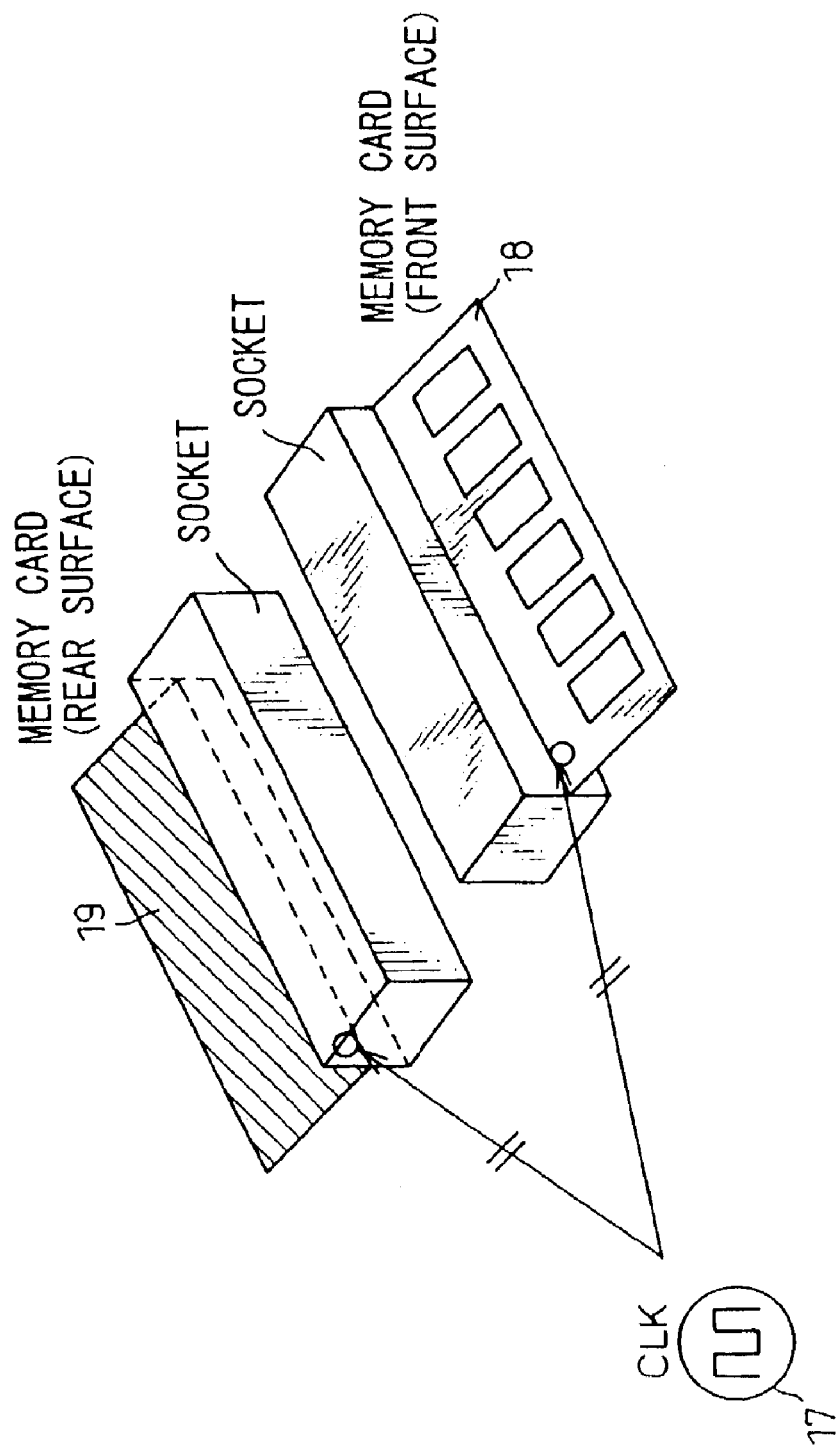
FIG. 6 is an enlarged view of an arrangement of memory cards shown in FIG. 5.

FIG. 6 is an enlarged view of an arrangement of the memory cards 18 and 19 shown in FIG. 5.

In FIG. 6, the memory card 18 and the basic arrangement of the memory socket is not different from that in the prior art, however, the memory card 19 is inserted into the memory socket with the rear surface facing upward. In this embodiment, a new memory socket for the memory card 19 is provided with socket pins mounted on the board. The socket pins are arranged in the order opposite to the order of socket pins of the conventional socket. The constitution of such a memory socket will be discussed hereinafter in detail.

Figure 4:
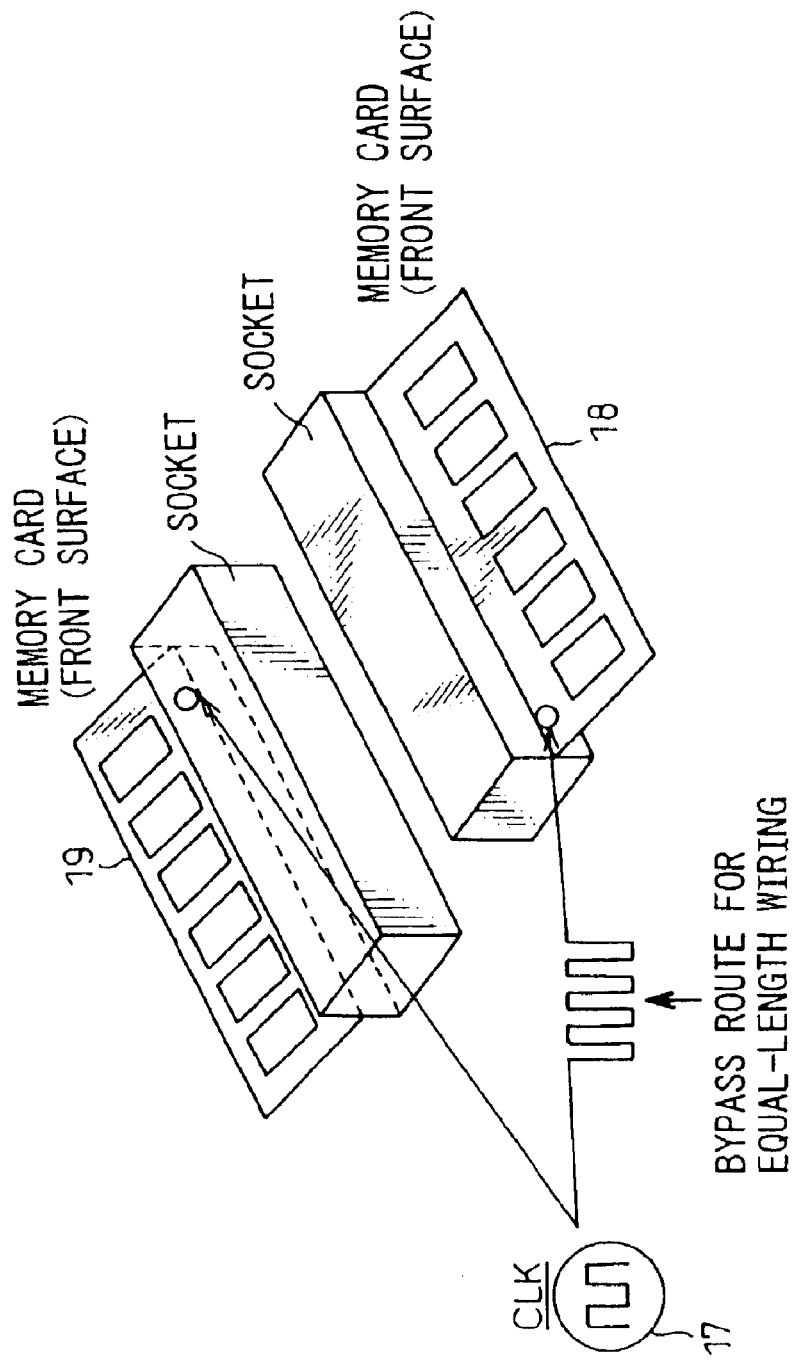
FIG. 4 shows a conventional parallel arrangement of memory sockets facing in opposite directions.

By using the memory socket of the invention shown in FIG. 6, a space which is provided between the memory cards 18 and 19 to make it possible to insert or remove the memory card in to or from the corresponding memory socket can be reduced, because the arrangement of the memory sockets is similar to the arrangement shown in FIG. 4. Therefore, a higher density mounting can be realized than the conventional horizontal-mounting in which the memory sockets facing in the same direction are arranged in parallel.

Figure 3:
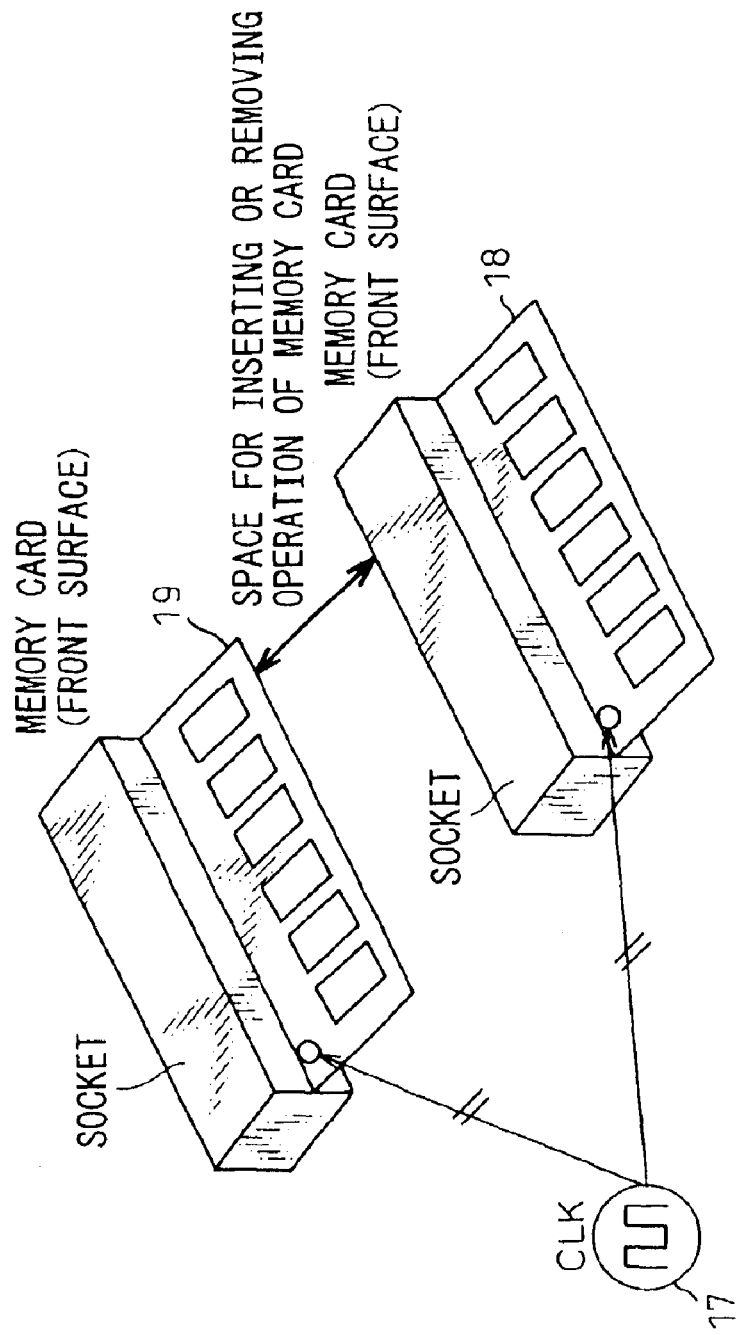
FIG. 3 shows a conventional parallel arrangement of memory sockets facing in the same direction.

Furthermore, by using the memory socket of the invention, the clock pins of the memory cards 18 and 19 are placed at the same distance from the clock source 17 as well as shown in FIG. 3, and, hence, the equal-length wiring can be easily realized. In the invention, the shortest equal-length wiring can be achieved because the pin numbers of the opposed sockets pins are identical, as will be discussed below.

Figure 7:
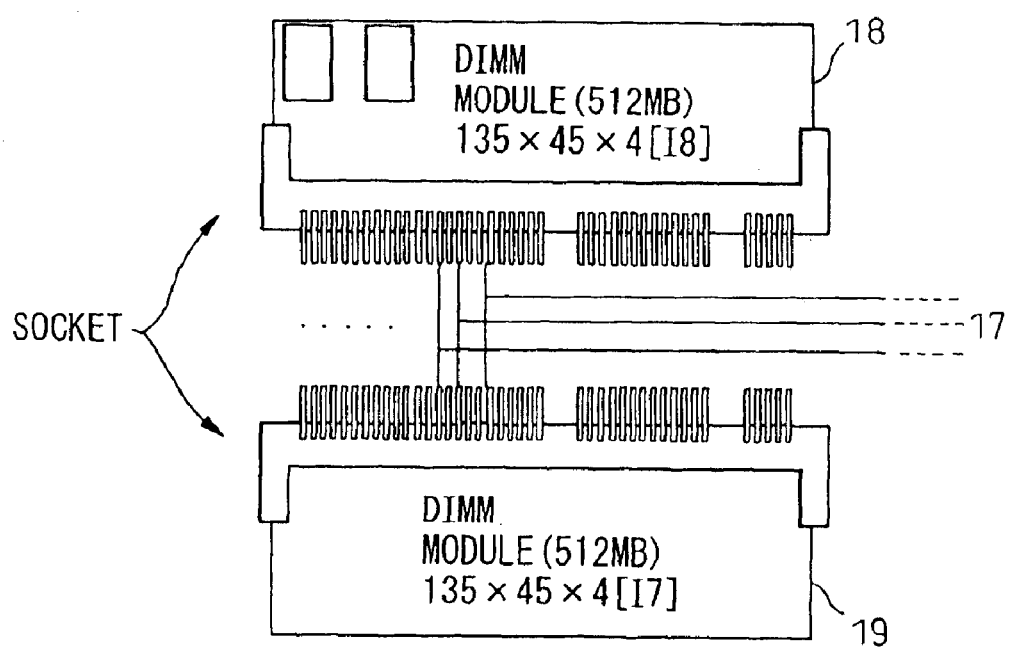
FIG. 7 shows an embodiment of a wiring arrangement of memory sockets in the invention.

FIG. 7 shows an example of wiring of the memory sockets of the invention.

For example, regarding a clock signal line, pairs of the opposed clock pins are simply connected to each other with the shortest length, and the clock signal line connected to the clock source 17 is connected to a midpoint of the shortest connection lines.

According to the structure of the invention, there is substantially no time difference (skew) between the clock signals provided to the two memory cards 18 and 19 and, hence, no bypass route is necessary. The same is true for wiring of address/data signal lines and control signal lines. This structure is particularly important in the point that it is not necessary to pay attention to the equal-length wiring even in a future wiring design in which faster clock signal lines of a few hundreds of MHz, etc., will be employed.

Figure 8A:
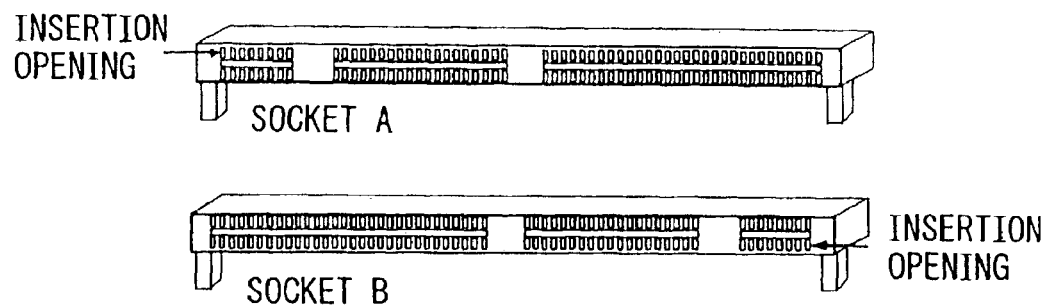
FIG. 8A shows an embodiment (1) of a DIMM memory socket according to the invention.
Figure 8B:
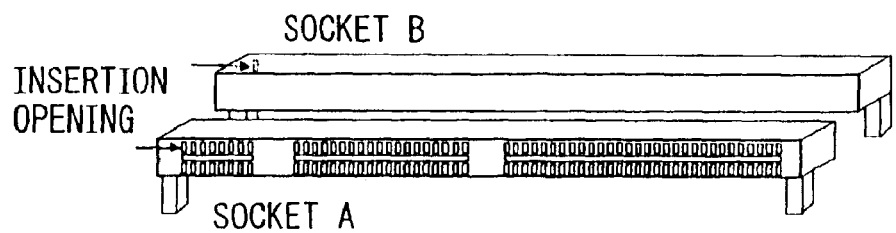
FIG. 8B shows an embodiment (2) of a DIMM memory socket according to the invention.
Figure 8C:
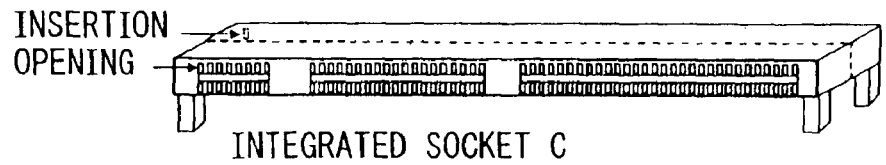
FIG. 8C shows an embodiment (3) of a DIMM memory socket according to the invention.

FIGS. 8A–8C show embodiments of DIMM memory sockets of the invention. A memory socket of the invention is very simple in structure, as will be described below, and therefore, a special technique, additional processes or costs for manufacturing the same are not involved, in comparison with a conventional memory socket.

FIG. 8A shows two kinds of memory sockets used in the invention. For example, the memory socket "A" is a conventional horizontal-mounting type socket to which the memory card 18 is mounted and the memory socket B is a newly designed horizontal-mounting type socket to which the memory card 19 is mounted with the rear surface facing upward.

As shown in the drawings, the arrangement order of the pins of the socket "A" and the arrangement order of the pins of the socket B are opposite to each other. FIG. 8B shows an arrangement in which the two memory sockets are juxtaposed in parallel and are oriented in opposite directions. The arrangement in FIG. 8B corresponds to the arrangement shown in FIGS. 5–7. With this structure, the pins of the memory socket "A" and the pins of the memory socket B are arranged in the same direction. Consequently, the opposed adjacent pins having same pin numbers can be interconnected at the shortest length (see FIG. 7).

FIG. 8C shows an integrated memory socket C made of a combination of the memory sockets "A" and B shown in FIG. 8B. With this structure, each pair of the pins having the same pin numbers of the memory sockets "A" and B can be replaced with a single pin. In this embodiment, the pins having same pin numbers of the memory cards 18 and 19 are inter-connected inside the memory socket C.

For example, select (enable) signal pins must be provided to the respective memory cards 18 and 19, but each pair of other signal pins, such as clock pins, address bus pins, data bus pins, control bus pins, etc., can be integrated into a single common pin. Thus, the number of the pins of the memory socket C can be reduced to approximately one-half of the number of the pins of the memory sockets "A" and. B. The area for wiring thereof can be also reduced to approximately one-half.

In a modified embodiment (referred to as a "memory socket C'") of the integrated memory socket C, which is not shown in the drawings, conventional vertical-mounting type DIMM sockets can be horizontally mounted in opposite directions in the vertical direction, unlike the memory socket C in which the memory cards 18 and 19 are directly inserted.

In this alternative, the memory cards 18 and 19 are mounted to conventional vertical-mounting type DIMM sockets. The vertical-mounting type DIMM sockets are horizontally mounted to the socket C' as an adapter, with front surfaces facing in opposite directions.

According to this embodiment, there are advantages that only one kind of socket, i.e., an existing vertical-mounting type socket is used for a DIMM socket, and the structure of the socket C' as an adapter is simple. The socket C' has the same mode of operations and effects as those of the integrated socket C. As a rule, the wiring is the equal-length wiring and the wiring area on the board can be reduced.

As mentioned above, according to the invention, there is provided a memory socket which can be designed so as to achieve the equal-length wiring without providing a bypass route and to reduce the wiring length. Thus, not only can the fast clock operation be performed but also the performance of the device can be enhanced.

What is claimed is:

1. A memory socket, for mounting a detachable memory card on a circuit board, comprising a first memory socket in which a first memory card is inserted, with a surface facing upward, a second memory socket in which a second memory card is inserted, with the other surface facing upward, said first memory socket and said second memory socket being arranged adjacent each other on said circuit board, said first and second memory cards being inserted from the outside of said first and second memory sockets in opposite directions;

wherein said first memory socket and said second memory socket have opposed pins which are arranged identically.

2. A memory socket, for mounting a detachable memory card on a circuit board, comprising a first memory socket in which a first memory card is inserted, with a surface facing upward, a second memory socket in which a second memory card is inserted, with the other surface facing upward.

said first memory socket and said second memory socket being arranged adjacent each other on said circuit board, said first and second memory cards being inserted from the outside of said first and second memory sockets, in opposite directions;

wherein said first memory socket and said second memory socket are integrated to form a single memory socket.

3. A memory socket according to claim 2, wherein pairs of opposed pins of said first and second memory sockets which form a single memory socket are each replaced with a single common pin.

* * * * *